(12) United States Patent
Ho et al.

(10) Patent No.: US 6,569,712 B2
(45) Date of Patent: May 27, 2003

(54) STRUCTURE OF A BALL-GRID ARRAY PACKAGE SUBSTRATE AND PROCESSES FOR PRODUCING THEREOF

(75) Inventors: Kwun-Yao Ho, Hsin Tien (TW); Moriss Kung, Hsin Tien (TW); Lin-Chou Tung, Hsin Tien (TW); Jackie Fu, Hsin Tien (TW)

(73) Assignee: Via Technologies, Inc., Taipei Hsien (TW)

( * ) Notice: Subject to any disclaimer, the term of this patent is extended or adjusted under 35 U.S.C. 154(b) by 0 days.

(21) Appl. No.: 10/083,105

(22) Filed: Feb. 27, 2002

(65) Prior Publication Data

US 2003/0075357 A1 Apr. 24, 2003

(30) Foreign Application Priority Data

Oct. 19, 2001 (TW) .......................................... 90125967 A
Oct. 19, 2001 (TW) .......................................... 90125968 A

(51) Int. Cl.[7] .............................................. H01L 21/48
(52) U.S. Cl. ........................ 438/121; 438/122; 438/108; 438/612; 438/613; 438/617; 438/667; 257/774; 257/772; 257/738; 257/780; 257/784

(58) Field of Search .................................. 438/121, 108, 438/122, 612, 613, 617, 667; 257/774, 772, 738, 780, 784

(56) References Cited

U.S. PATENT DOCUMENTS 5,773,884 A * 6/1998 Andros et al. .............. 257/707

* cited by examiner

*Primary Examiner*—Albert W. Paladini
*Assistant Examiner*—Luan Thai
(74) *Attorney, Agent, or Firm*—Troxell Law Office PLLC

(57) ABSTRACT

An improved structure of a ball-grid array (BGA) package substrate and processes for producing thereof are disclosed, wherein one side of the BGA substrate has a single pattern layer for connecting with solder balls and a heat sink layer is bonded to the other side of the substrate. The heat sink layer provides not only heat dissipation for the substrate, but also patterns for power and/or for ground, so as to diminish the dimension required for the patterns for power and/or for ground on the pattern layer of the substrate. The solder balls for power and/or for ground of the substrate are connected with the heat sink layer through electrically and thermally conductive via holes plugged with conductive paste.

12 Claims, 9 Drawing Sheets

STRUCTURE OF A BALL-GRID ARRAY PACKAGE SUBSTRATE AND PROCESSES FOR PRODUCING THEREOF

FIELD OF THE INVENTION

The present invention relates to a ball-grid array (BGA) packaging technique and, more specifically, to the packaging technique of a ball-grid array (BGA) substrate having a heat sink layer. The heat sink layer can act as a ground plane or as a power plane or act as a both ground and power pattern plane, and thus shares the burden of the BGA pattern plane.

BACKGROUND OF THE INVENTION

Following the advancement of manufacture of the integrated circuits (IC), it has become a trend to reduce the unit cost through diminution in the integral dimension of the die. The semiconductor manufacturers even expect that the performance of a certain aspects, such as processing speed can consequently gain remarkable improvements and that a single IC chip can encompass more functions. However, under the circumstances that the dimension of the die is diminished without lessening but adding the devices so as to increase the functions of the IC chips, it causes that the interconnects are inversely more intensive, and the accompanying increases in parasitical electric capacitance and electric resistance of the interconnects lead to degradation of the performance of the chips.

In order to solve the aforesaid problems, the semiconductor fabrication industry not only replaces the traditional aluminum conductive wires with copper conductive wires having a low electric resistance so as to reduce the electric resistance of conductive wires, but also gropes for dielectric layers with a low dielectric constant to resolve the issue of parasitical electric capacitance. Another factor with a direct and crucial effect on the cost and performance is the packaging technique, which can be understood because the I/O terminals will doubtless considerably increase in response to connection with the system when the IC chip devices step up to include new functions. And simultaneously the issues of the power consumption and heat dissipation of the IC chips are thus more prominent. Even such newly technology as the flip chip packaging technique and the ball-grid array (BGA) substrate packaging technique, also have to overcome the above-mentioned problems.

The steps of the conventional BGA substrate packaging process are described as follows:

Firstly, please refer to FIG. 1a, TAB sprocket holes 10 are punched in the sides of a substrate 5 which is pressed with a copper foil 8, and thus facilitate transportation of the substrate 5 on the conveying belt. The substrate 5 can be one of BT (bismaleimide-triazine), polyimide and enhanced epoxy resin etc. with/without glass fiber reinforced insulating substrates. For T-BGA, there is typically only one layer of a metal pattern on the substrate and the copper foil 8 is used to define a conductive trace and a pattern for connecting solder balls.

Then, as shown in FIG. 1b, the surface of the TAB sprocket holes 10 is desmeared and chemically polished, etc. Subsequently, a photo resist (not shown) is coated on the copper foil 8 and the copper foil 8 is processed with the photolithography procedures in order to define the pattern. After developed, the copper foil 8 is etched by using a photo resist pattern as the etching mask so as to form a conductive pattern and/or a pattern for connecting solder balls 20. Lastly, the photo resist is stripped.

Afterwards, as shown in FIG. 1c, a tape film 25 is covered on the backside of the substrate 5 opposite to the copper foil 8 so as to prevent the substrate from staining a solder mask. A layer of the solder mask 30, which is insulating is subsequently coated on the copper foil 8. The solder mask on the pattern 20 for connecting solder balls of the copper foil 8 is then removed through the photolithography procedures and the developing step.

Referring to FIG. 1d, the electroplating procedure subsequently proceeds so as to form in turn a nickel film layer and a gold film layer 35 on the copper foil 8. The tape film 25 is then immediately removed.

Please refer to FIG. 1e, the substrate is slit, and then an adhesive layer 42 is stuck to the backside of the substrate 5. The material in the central region of the substrate is cut off to form a cavity 40 for receiving the chip. If necessary, bus line through holes and device through holes are punched. Then, another copper foil 55 is stuck onto the adhesive layer 42 to make a heat sink layer and to support the BGA substrate. Finally, solder balls 45 are formed on the gold film layer 35. The result is as shown in FIG. 1f.

In the traditional process, it needs to stick the heat sinks piece by piece onto the adhesive layer 42 in order to form the heat sink layer. In this connection, it is time-consuming and the effect of heat dissipation is also restricted due to the fact that the heat sink 55 is separated from the power rings or ground rings in the front surface of the pattern layer by the layer of the insulating substrate without connection with each other.

The technique as shown in FIG. 1g and FIG. 1h is employed by 3M company, which plates the TAB sprocket holes 10 by electroless plating after punching the TAB sprocket holes 10 so that the front surface of the substrate pattern can be connected with the heat sink layer. However, the above-mentioned partial connection is unable to sufficiently dissipate the heat of the pattern layer.

Therefore, the efficiency of the heat sink layer of the BGA substrate made by the prior art is not good. The present invention provides a new construction of the BGA substrate and the producing process thereof to improve the aforesaid problems.

SUMMARY OF THE INVENTION

The one objective of the present invention is to provide an improved structure of a ball-grid array package substrate and processes for producing thereof.

Another objective of the present invention is to connect the pattern layer of a BGA substrate with patterns for ground and for power of the heat sink layer through electrically and thermally conductive via holes which are plugged with conductive paste.

An improved structure of a ball-grid array package substrate is disclosed, wherein one side of the BGA substrate has a single pattern layer for connecting with solder balls as well as conductive lines, and a heat sink layer is bonded to the other side of the substrate. The heat sink layer is also a layer for ground so as to provide an additional dimension required by the pattern layer for ground patterns, where the ground solder balls of the substrate are connected with the heat sink layer through electrically and thermally conductive via holes plugged with conductive paste. Alternatively, the heat sink layer can also include only patterns for power so as to provide an additional dimension required by the BGA pattern layer for power patterns.

Furthermore, the heat sink layer can also include patterns both for ground and for power so as to provide an additional dimension required by the BGA pattern layer, and hence the heat sink layer has better electrical and thermal performances.

The process for producing the structure of the ball-grid array package substrate of this invention is that two sides of a substrate are respectively covered with one layer of a release film, and then the substrate is drilled and slit to form a plurality of via holes and a cavity, wherein the via holes are located in predetermined positions of solder balls for ground or for power of the substrate, and the cavity is located for receiving a chip. Afterwards, the via holes of the substrate are plugged with conductive paste.

In a first embodiment of the present invention, one layer of the release film is subsequently removed from one side of the substrate to laminate a heat sink layer thereon, and then a layer of black oxide is formed onto the surface of the heat sink layer within the cavity. After the remaining layer of the release film is removed from the other side of the substrate, a copper foil is laminated thereon. Then, the copper foil is patterned by means of photolithography and etching technology to form a BGA pattern layer having patterns for connecting solder balls and conductive traces. Black ink is coated on the surface of the heat sink layer for insulating, and a solder mask is coated on the pattern layer. Subsequently, another photolithography procedure is performed to bare portions of the pattern layer where the solder balls are connected. An electroplating or electroless plating process is performed to plate in turn a Ni film and an Au film on the uncovered portions of the pattern layer, and then the solder balls are mounted onto the Au film of the pattern layer. Finally, the chip is set onto the layer of black oxide in the cavity, and bonding pads of the chip are connected with the pattern layer by wire bonding, and then a resin is filled in the cavity to fix the chip and the wires.

In a second embodiment of the present invention, after the via holes of the substrate are plugged with conductive paste in the first embodiment, the two layers of the release films are removed. Then, a copper foil and a heat sink layer are laminated onto the substrate. Next, the copper foil is patterned by photolithography and etching technology to form a BGA pattern layer. Subsequently, a protective film is stick onto the BGA pattern layer. After a layer of black oxide is formed onto the surface of the heat sink layer within the cavity, the protective film is removed. The other subsequent steps are the same as described in the first embodiment.

The steps of the process for producing the structure of the ball-grid array package substrate of which the heat sink layer has patterns both for ground and for power, i.e. a third embodiment of this invention, are that two sides of a substrate having a layer of copper foil on one side thereof are respectively covered with one layer of a release film. The substrate is then drilled and slit to form a plurality of via holes and a cavity therein, wherein the via holes are located in predetermined positions of ball-grid for ground and of ball-grid for power of the substrate, and the cavity is located for receiving a chip. Next, the via holes of the substrate are plugged with conductive paste. The release films are removed and a heat sink layer is laminated on the other side of the substrate. The copper foil and the heat sink layer of the substrate are respectively covered with a protection film, and then a layer of black oxide is formed onto the surface of the heat sink layer within the cavity.

After the protection films are removed, the copper foil is patterned by means of photolithography and etching technology to form a BGA pattern layer having signal patterns, conductive traces and patterns for connecting power solder balls and ground solder balls. Moreover, the heat sink layer is also patterned to form therein patterns for power and for ground. Later, black ink is coated on the surface of the heat sink layer for protection, and a solder mask is coated on the pattern layer. Subsequently, another photolithography procedure is performed to bare portions of the pattern layer where the solder balls are connected. An electroplating or electroless plating process is performed to plate in turn a Ni film and an Au film on the uncovered portions of the pattern layer, and then the solder balls are mounted onto the Au film of the pattern layer. Finally, the chip is set onto the layer of black oxide in the cavity, and bonding pads of the chip are connected with the pattern layer by wire bonding, and then a resin is filled in the cavity to fix the chip and the wires.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DETAILED DESCRIPTION OF THE PREFERRED EMBODIMENTS

As the foregoing depicted in the Background of the Invention, the layer of heat sink stuck to the substrate in the prior art is separated from the pattern layer by the insulating substrate, and thus the heat dissipating effect which can be reached is surely limited. Although the conventional BGA substrate makes connections between the heat sink layer and the pattern layer, e.g. as disclosed in the patent of 3M company, there are merely about eight sprocket holes retained on the conveying belt to provide such connections in one substrate. Thus, the effect of the heat dissipation is not much raised. In view of this, the present invention provides a structure of a ball-grid array package substrate having an improved efficiency of a heat sink layer and the producing process thereof to solve the aforesaid problems.

The steps of the process for producing the structure of the ball-grid array package substrate in accordance with one of the embodiments of the present invention are as shown in FIGS. 2a to 2l.

Figure 1A:
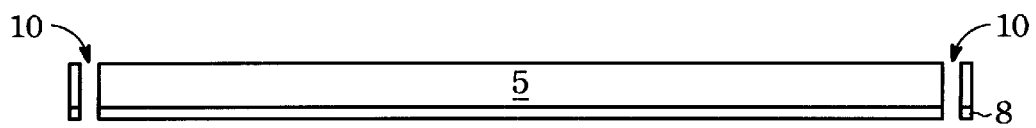
FIGS. 1a to 1f show the formation procedures of the traditional BGA substrate in the prior art, wherein the heat sink layer is not connected with the BGA pattern layer.
Figure 1B:
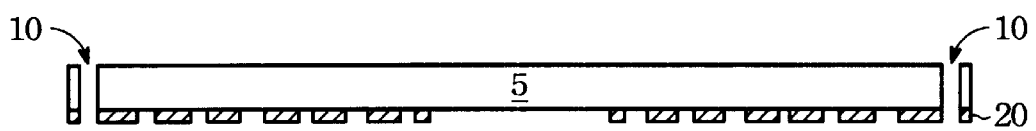
Figure 1C:
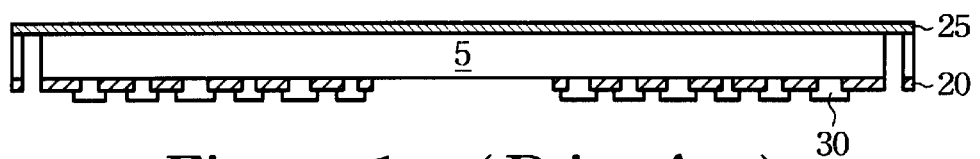
Figure 1D:
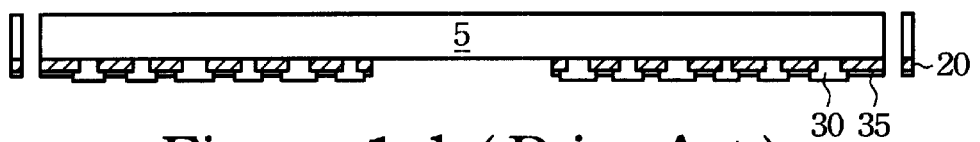
Figure 1E:
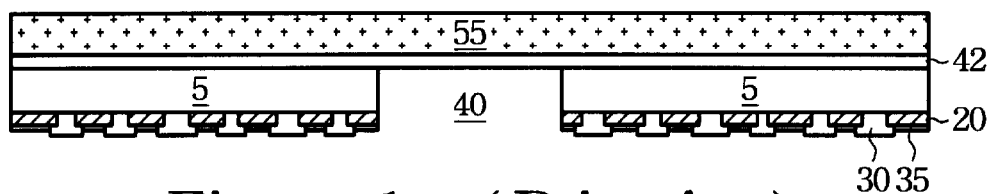
Figure 1F:
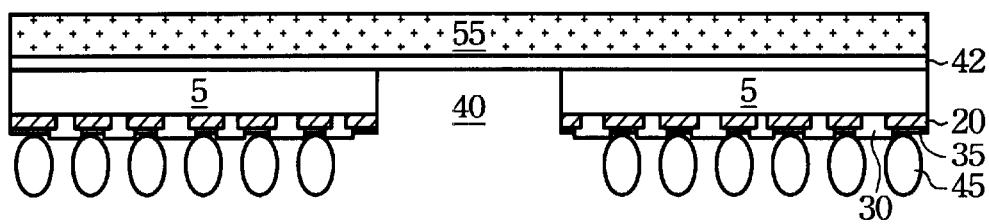
Figure 1G:
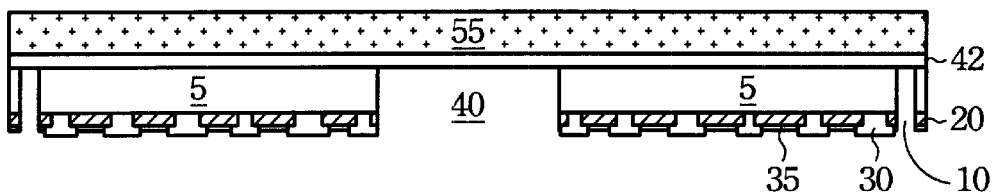
FIGS. 1g to 1h show another BGA substrate made by the conventional technique, wherein the BGA pattern layer of the substrate is connected with the heat sink layer through merely the TAB sprocket holes.
Figure 1H:
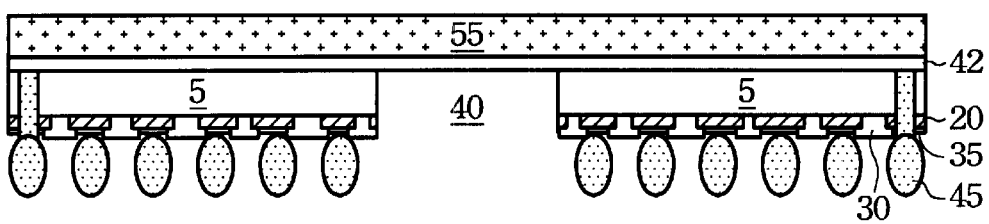
Figure 2A:
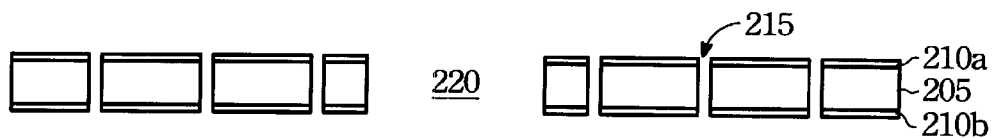
FIGS. 2a to 2l show the steps of the process for producing a BGA substrate in accordance with the first embodiment of the present invention, wherein the heat sink layer is connected with the ground solder balls of the BGA pattern layer through the electrically conductive via holes which also have the function of thermal conduction.
Figure 2B:
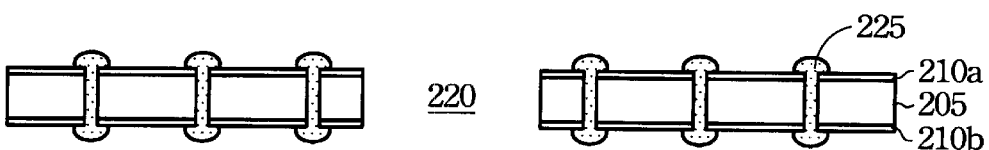

First, please refer to FIG. 2a. The two sides of a flexible or rigid substrate 205 are respectively pasted with one layer of a release film 210a, 210b by using adhesive tapes. The release film is selected from the films which are easily separated from conductive paste, such as polyethylene film, polypropylene film, polyester (PET) film or acrylic resin. Subsequently, the substrate 205 is drilled mechanically or by the $CO_2$ laser or is punched to form via holes 215, and is slit or punched to form a cavity 220. The via holes 215 are located in predetermined positions of solder balls for ground. Then, referring to FIG. 2b, the via holes 215 are plugged with conductive paste 225 in a manner of printing to form electrically conductive via holes. As the front side and the backside of the substrate 205 are respectively covered with the layers of the release films 210a and 210b, the conductive paste 225 only attach to the vicinity of the via holes 215 to form a rivet configuration as shown in FIG. 2b.

Figure 2C:
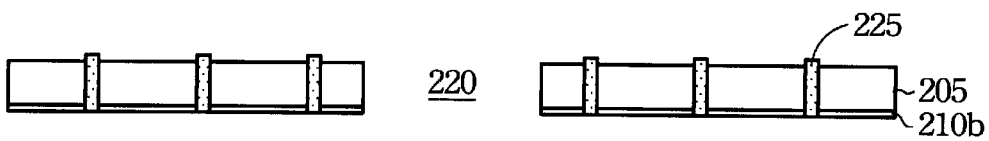

Afterwards, a scraping tool is used to scrape off the conductive paste lumps that are above the surfaces of the front side and the backside of the substrate 205. The layer of the release film 210a is then removed, but the layer of the release film 210b is retained. The result is as shown in FIG. 2c.

Figure 2D:
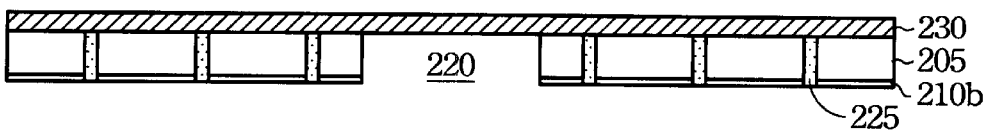
Figure 2E:
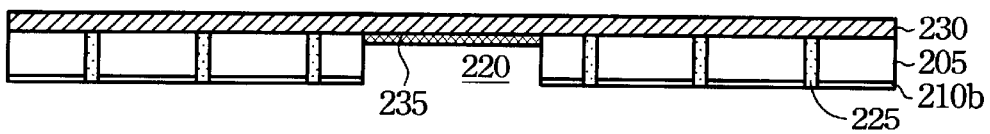
Figure 2:
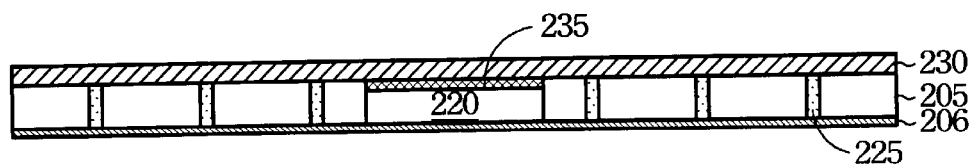
FIG. 2m is the BGA substrate structure produced by the process in accordance with the first and second embodiment of the present invention.
Figure 2:
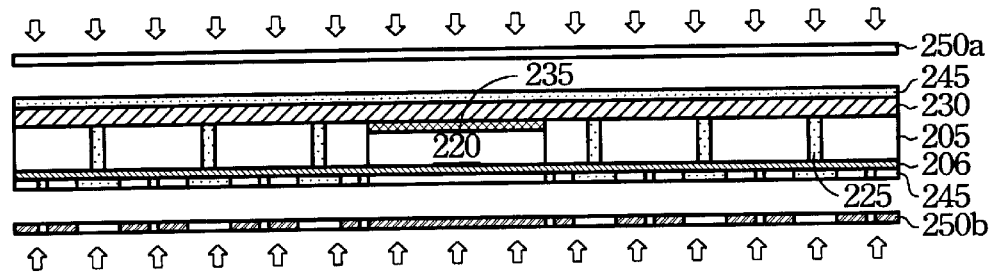
Figure 2:
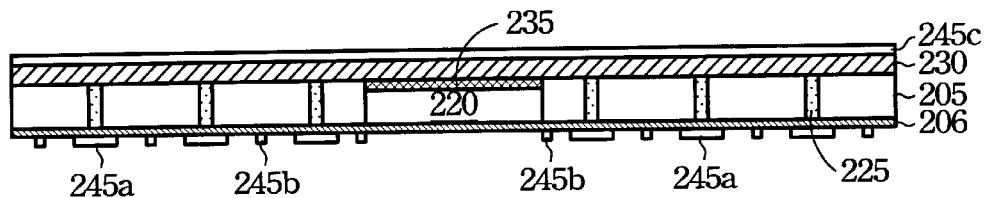
Figure 2:
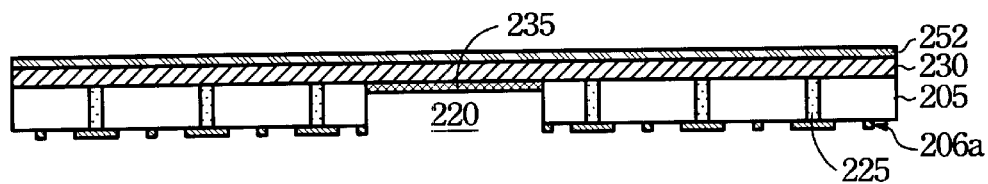

Referring to FIG. 2d, a thicker copper foil is formed on the backside of the substrate 205 by means of heat lamination to be a heat sink layer 230. Subsequently, as shown in FIG. 2e, a layer of black oxide 235 which provides adhesion to fix a chip (not shown) in the cavity 220 is formed through chemical reaction onto the surface of the heat sink layer within the cavity 220.

Referring to FIG. 2f, after removal of the layer of the release film 210b, another copper foil 206 is laminated onto the front side of the substrate 205 to be a pattern layer of the BGA substrate. Subsequently, as shown in FIG. 2g, the heat sink layer 230 and the copper foil 206 are respectively coated with a negative photo resist 245 and then exposed to define a respective pattern by using photo masks 250a and 250b as the respective photolithography mask.

As shown in FIG. 2h, patterns of photo resist 245a, 245b and 245c are formed through the developing procedure. Since the employed mask 250a over the heat sink layer 230 is transparent, the photo resist 245c on the heat sink layer 230 will not be removed after exposure and developing. In addition to the pattern of photo resist 245a for connecting solder balls, the copper foil 206 has the pattern of photo resist 245b for the conductive traces as etching masks.

Referring to FIG. 2i, an etching solution is used to etch the copper foil 206 with the patterns of photo resist 245a, 245b and 245c as masks in order to form a pattern layer of 206a. Then, the photo resist patterns 245a, 245b and 245c are stripped.

Figure 2J:
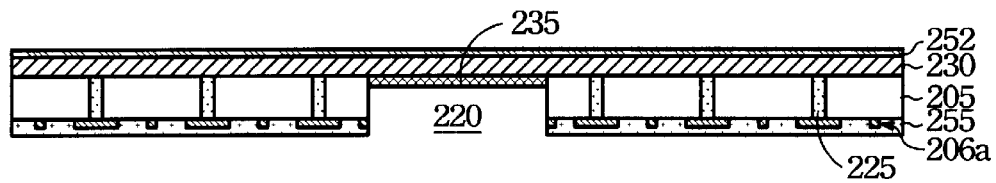

As shown in FIG. 2j, the heat sink layer 230 is then coated with black ink 252 to form a protection layer. Alternatively, a metallic (such as Ni or Al) layer can be plated or deposited on the heat sink layer 230 for protection. Then, the pattern layer 206a is coated with a solder mask 255.

Figure 2K:
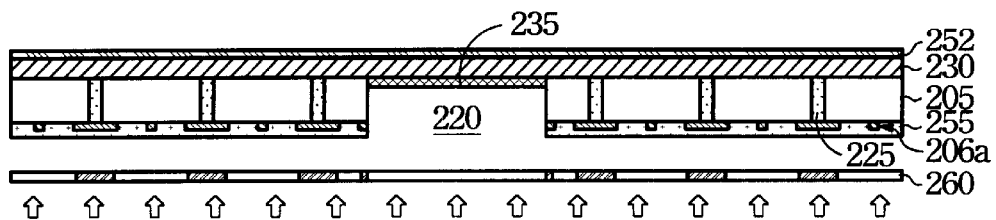
Figure 2L:
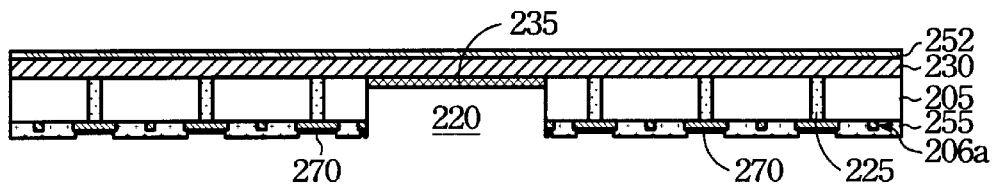

Referring to FIG. 2k, the procedures of exposure and developing are performed by using a photo mask 260 so as to bare the copper foil 206a where the solder balls are connected. Through the electroplating process, a Ni film layer and an Au film layer 270 are then in turn plated on the uncovered copper foil 206a, and the result is as shown in FIG. 2l.

Figure 2M:
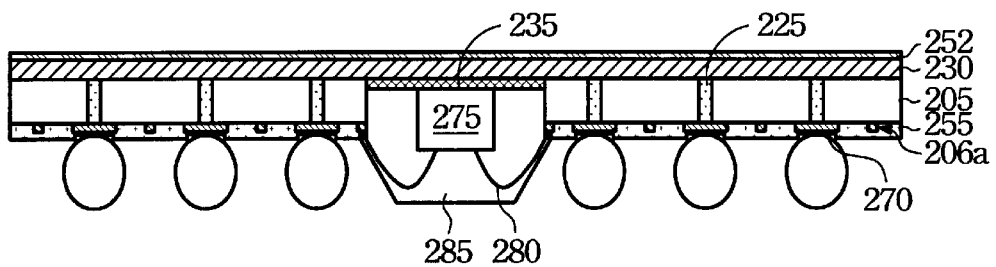

Furthermore, the solder balls are mounted on the layer plated with the gold film. Afterwards, a chip 275 is settled in the cavity 220 and bonding pads on the chip 275 are connected to the pattern layer 206a with wires 280. Finally, a resin 285 is used to wrap up the chip 275 and the wires 280, and thus the structure is obtained as shown in FIG. 2m.

Figure 3:
FIGS. 3a to 3d show the steps of the process for producing a BGA substrate in accordance with the second embodiment of the present invention, wherein only the steps different from those in the first embodiment are shown.
Figure 3:
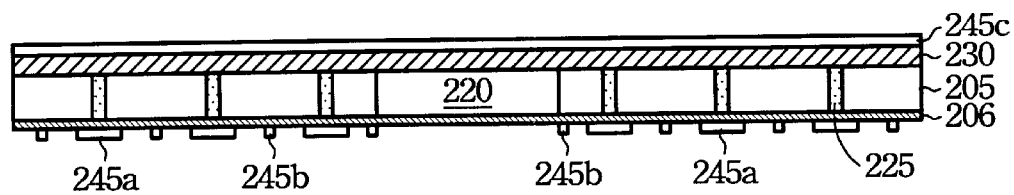
Figure 3:
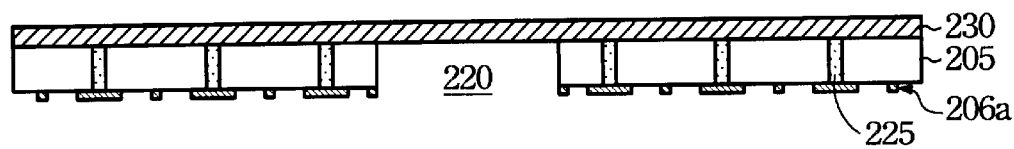
Figure 3:
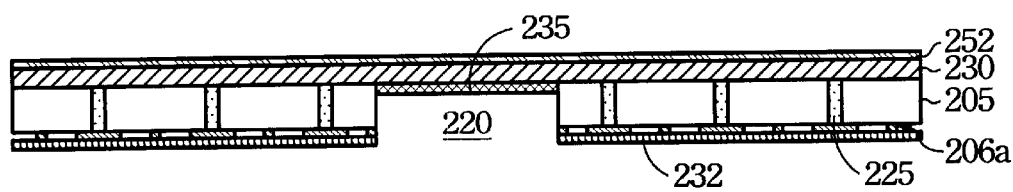

In the aforesaid procedures of the process, the sequence of parts of the steps is changeable without affecting the final result. For instance, the steps of the process of a second embodiment in accordance with the present invention are described as below:

Referring to FIG. 3a, after the via holes 215 are plugged with the conductive paste 225, as seen in FIG. 2b, the conductive paste lumps that are above the surfaces of the front side and the backside of the substrate 205 are scraped off, then the layers of the release films 210a and 210b are removed, and moreover, both the copper foil 206 and the heat sink layer 230 are simultaneously laminated onto the two sides of the substrate 205.

Subsequently, as shown in FIG. 3b, patterns of photo resist 245a, 245b and 245c are formed through the developing procedure. Then, the etching procedure is performed with the patterns of photo resist 245a, 245b and 245c as masks in order to form a pattern layer 206a, which is used to construct the patterns for connecting solder balls and the conductive traces, and the photo resist patterns 245a, 245b and 245c are stripped. The result is as shown in FIG. 3c.

Further, as shown in FIG. 3d, the heat sink layer 230 is coated with black ink 252 to form a protection layer. A protective film 232 is then covered onto the pattern layer 206a. Subsequently, a layer of black oxide 235 is formed through chemical reaction onto the surface of the heat sink layer within the cavity 220.

Afterwards, the protective film 232 is removed. Then, the same as depicted in the first embodiment, the solder mask 255 is coated, the photolithography procedures are performed to bare the copper foil where the solder balls are connected, the Ni film layer and the Au film layer are plated, and finally the solder balls are connected to the pattern layer 206a. The result is the same as shown in FIG. 2m.

Figure 4:
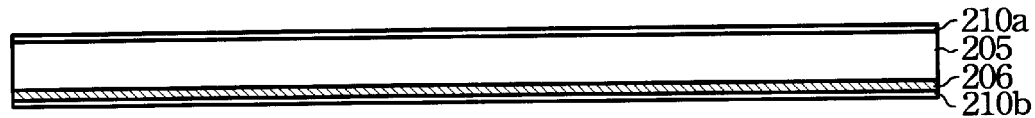
FIGS. 4a to 4j show the steps of the process for producing a BGA substrate in accordance with the third embodiment of the present invention, wherein the ground solder balls and power solder balls of the BGA pattern layer are respectively connected with the patterns for power and for ground of the heat sink layer through the electrically conductive via holes which also have the function of thermal conduction.
FIG. 4k is the BGA substrate structure produced by the process in accordance with the third embodiment of the present invention.
Figure 4:
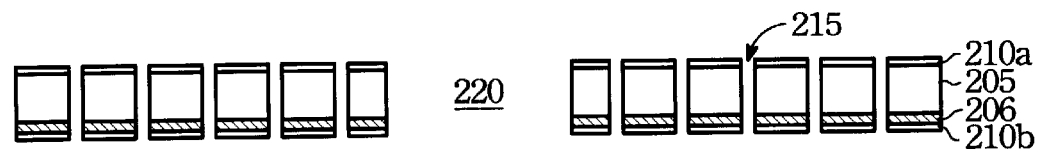
Figure 4:
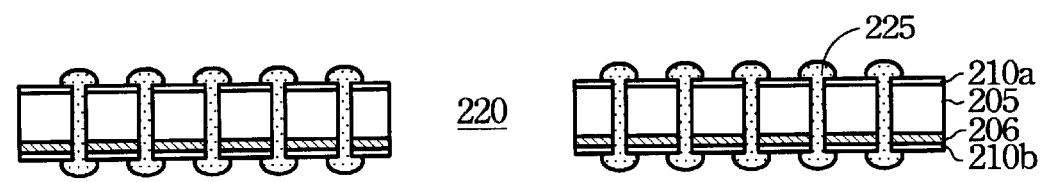
Figure 4:
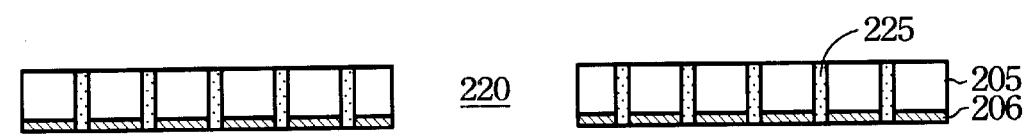
Figure 4:
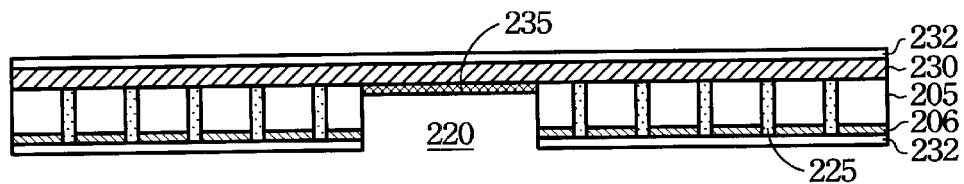
Figure 4:
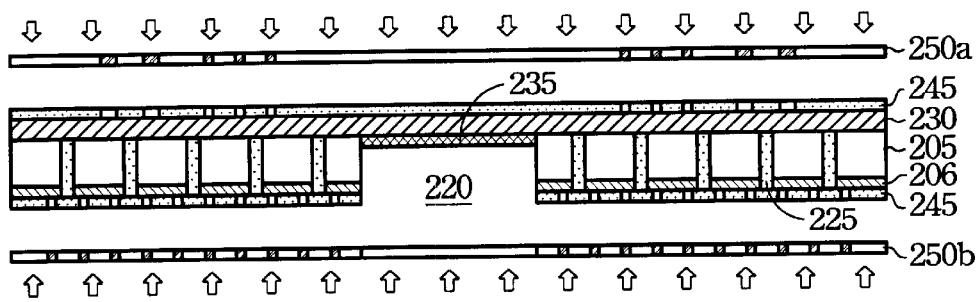
Figure 4:
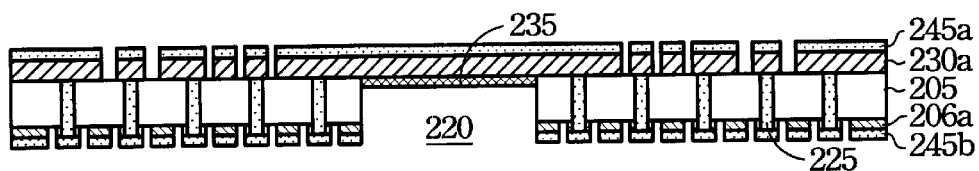
Figure 4:
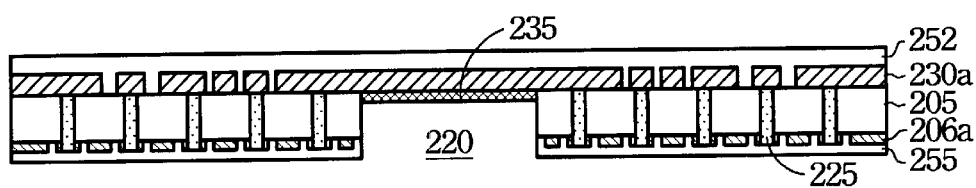
Figure 4:
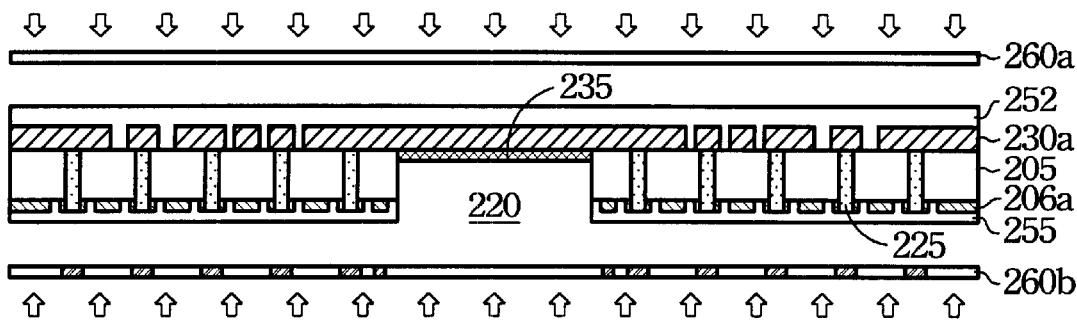
Figure 4:
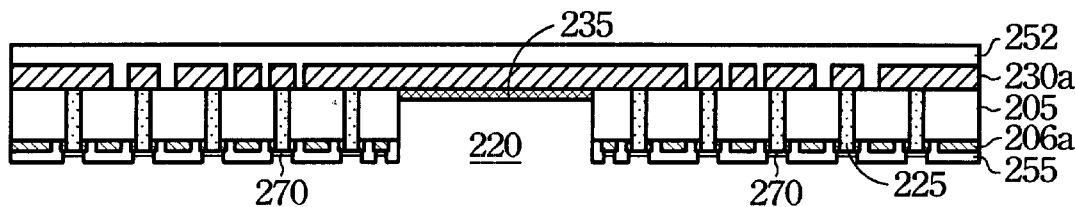
Figure 4:
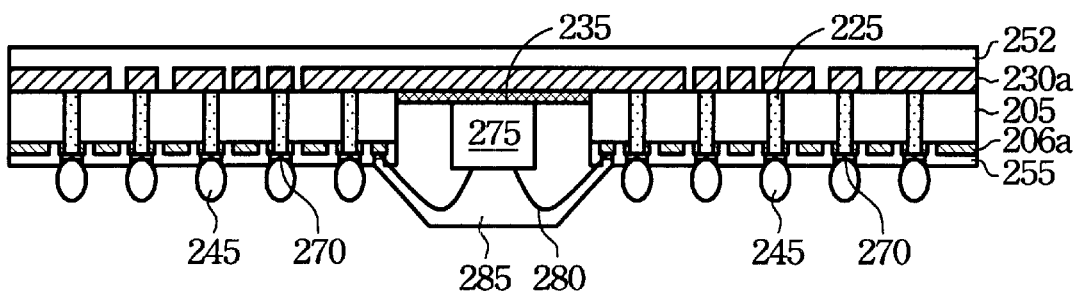

Furthermore, certain patterns for power and for ground on the pattern layer of the BGA substrate can be distributed to the heat sink layer since the pattern layer and the heat sink layer on both sides of the substrate are connected with each other through the electrically conductive via holes. Hence, the steps of the process of a third embodiment in accordance with the present invention are described as below:

Please refer to FIG. 4a. Firstly, the two sides of a substrate 205 including a layer of copper foil 206 (on the front side of the substrate) are respectively pasted with one layer of a release film 210a, 210b by using adhesive tapes. The release film is also selected from the films which are easily separated from conductive paste, such as polyethylene film, polypropylene film, polyester (PET) film or acrylic resin. Subsequently, the substrate 205 is drilled mechanically or by the $CO_2$ laser or is punched to form via holes 215, and is slit or punched to form a cavity 220, as shown in FIG. 4b. The via holes 215 are located in predetermined positions of ball-grid for ground and of ball-grid for power. Then, as shown in FIG. 4c, the via holes 215 are plugged with conductive paste 225 in a manner of printing to form electrically conductive via holes. As the front side and the backside of the substrate 205 are respectively covered with the layers of the release films 210a and 210b, the conductive paste 225 only attach to the vicinity of the via holes 215 to form a rivet configuration as shown in FIG. 4c.

Afterwards, a scraping plank is used to scrape off the conductive paste lumps that are above the surfaces of the substrate 205. The layers of the release films 210a and 210b are then immediately removed, and the result is as shown in FIG. 4d.

Referring to FIG. 4e, a thicker copper foil 230 is formed on the backside of the substrate 205 by means of heat lamination to be a heat sink layer 230. A protective film 232 is then stuck onto the copper foil 206 and the heat sink layer 230 respectively. Subsequently, a layer of black oxide 235, which provides a rough surface for a subsequent treatment of chip attaching (not shown) in the cavity, is formed through chemical reaction onto the surface of the heat sink layer within the cavity 220.

Referring to FIG. 4f, after removal of the protective films 232, the heat sink layer 230 and the copper foil 206 are respectively coated with a negative photo resist 245 and then exposed to define a respective pattern by using photo masks 250a and 250b as the respective photolithography mask. The photo mask 250a includes patterns for power and patterns for ground. And the photo mask 250b includes signal, power, and ground patterns.

As shown in FIG. 4g, patterns of photo resist 245a and 245b are formed through the developing procedure. The pattern of photo resist 245a on the heat sink layer 230 defines the patterns for power/the patterns for ground, and the pattern of photo resist 245b on the copper foil 206 defines the conductive trace of signals and the patterns of power/ground for connecting solder balls.

Subsequently, the etching procedure is applied to the heat sink layer 230 and the copper foil 206 with the patterns of photo resist 245a and 245b as masks in order to form a pattern layer of 230a and a pattern layer of 206a. That is to say, by employing the method of this invention, the patterns for power and the patterns for ground necessary in the BGA pattern layer can be moved to the heat sink layer 230, and only the signal patterns and the patterns necessary for connecting solder balls are arranged on the copper foil 206. In such way, not only the dimension required by the whole BGA can be narrowed, but also the noise can be reduced as a result that the signal conductive wires are allocated on one side of the substrate and the conductive traces for power and for ground etc. on the other side thereof.

As shown in FIG. 4h, the residual photo resist patterns are stripped and then the pattern layer of heat sink 230a is coated with black ink 252 to form a protection layer. Alternatively, a metallic (such as Ni or Al) layer can be plated or deposited on the pattern layer of heat sink 230a for protection. Then, the pattern layer 206a is coated with a solder mask 255.

Referring to FIG. 4i, the photolithography procedures of exposure and developing etc. are performed by using photo masks 260a and 260b as masks so as to bare the copper foil 206a where the solder balls are connected. The uncovered copper foil 206a is used to connect with power and ground solder balls. The electroplating process is then performed by using the solder mask and the black ink as masks. The Ni film layer and Au film layer 270 are in turn plated and the result is as shown in FIG. 4j.

Referring to FIG. 4k, the solder balls are mounted on the layer plated with the gold film. Afterwards, a chip 275 is settled in the cavity 220 and bonding pads on the chip 275 are connected to the pattern layer 206a with wires 280. Finally, a resin 285 is used to wrap up the chip 275 and the wires 280, and thus the structure is obtained as shown.

The advantages of the present invention are described as below:

1. The conductive solder balls and conductive lines for power and/or for ground on the substrate are connected with the heat sink layer through a plurality of the electrically conductive via holes, which facilitates heat dissipation.
2. The via holes connect the front side of the substrate with the backside thereof through being plugged with the conductive paste, and the typical sprocket holes provides connection by being electroplated. The former is much more convenient and inexpensive since the conventional procedures of desmearing, chemical polishing and copper plating are omitted; moreover, the release film layers facilitating hole plugging are used to prevent the conductive paste from staining the portion of the copper foil unnecessary for connection.
3. By using available heat sink laminating during substrate process for mass production, it need not punch the pattern finished substrate into pieces and then laminate the heat sinks piece by piece onto the substrate, which is labor- and material-consuming. Thus, the procedures of the whole process will be simplified with lower cost.
4. The heat sink layer of the present invention can be further employed as patterns for power and/or for ground, that is, the heat sink layer can be regarded as ground, power, stiffener and heat sink, and thus it can diminish the dimension required for the power and/or ground patterns on the BGA substrate pattern layer. Therefore, the flexibility of layout design is increased.

As is understood by a person skilled in the art, the foregoing preferred embodiment of the present invention is illustrated of the present invention rather than limiting of the present invention. It is intended to cover various modifications and similar arrangements included within the spirit and scope of the appended claims, the scope of which should be accorded the broadest interpretation so as to encompass all such modifications and similar structure.

What is claimed is:

1. A process for producing a structure of a ball-grid array (BGA) package substrate, comprising the steps of:

providing a substrate, wherein two sides of said substrate are respectively covered with one layer of a release film;

forming a plurality of via holes and a cavity in said substrate, wherein said via holes are located in predetermined positions of solder balls for ground of said substrate, and said cavity is located for receiving a chip;

plugging conductive paste in said via holes of said substrate;

removing said release films;

laminating a heat sink layer and a copper foil respectively on said two sides of said substrate;

patterning said copper foil to form a pattern layer having patterns for connecting said solder balls and conductive traces of said substrate;

coating black ink on said heat sink layer;

forming a layer of black oxide onto the surface of said heat sink layer within said cavity;

coating a solder mask on said pattern layer;

performing a photolithography procedure to bare portions of said pattern layer where said solder balls are connected;

performing an electroplating process to plate in turn a Ni film and an Au film on said uncovered portions of said pattern layer;

mounting said solder balls onto said Au film of said pattern layer; and setting said chip onto said layer of black oxide, and connecting bonding pads of said chip with said patterns for connecting said solder balls as well as said conductive traces of said substrate by wire bonding.

2. The process of claim 1, wherein said conductive paste comprises silver paste and copper paste, and said via holes are plugged with said conductive paste by printing.

3. The process of claim 1, wherein said release films are easily separated from with said conductive paste.

4. The process of claim 1, wherein said release film comprises polyethylene film, polypropylene film, polyester (PET) film or acrylic resin.

5. The process of claim 1, wherein said substrate is selected from the group consisting of a flexible type and a rigid type.

6. The process of claim 1, further comprising covering a protective film on said pattern layer before forming a layer of black oxide within said cavity and then removing said protective film before said solder mask is coated.

7. A process for producing a structure of a ball-grid array (BGA) package substrate, comprising the steps of:

providing a substrate, wherein one side of said substrate includes a layer of copper foil;

covering the two sides of said substrate respectively with one layer of a release film;

forming a plurality of via holes and a cavity in said substrate, wherein said via holes are located in predetermined positions of ball-grid for ground and of ball-grid for power of said substrate, and said cavity is located for receiving a chip;

plugging conductive paste in said via holes of said substrate;

removing said release films;

laminating a heat sink layer in the other side of said substrate;

forming a layer of black oxide onto the surface of said heat sink layer within said cavity;

patterning said copper foil to form a pattern layer having signal patterns and patterns for connecting power solder balls and for connecting ground solder balls;

patterning said heat sink layer to form therein patterns for power and for ground;

coating a black ink layer on said heat sink layer;

coating a solder mask on said pattern layer, and then performing a photolithography procedure to bare portions of said pattern layer where said power solder balls and said ground solder balls are connected;

performing an electroplating process to plate in turn a Ni film and an Au film on said uncovered portions of said pattern layer; and mounting said solder balls onto said Au film of said pattern layer so that said power solder balls and said ground solder balls of said substrate are respectively connected to said patterns for power and for ground of said heat sink layer through said conductive paste in said via holes of said substrate; and setting said chip onto said layer of black oxide, and then connecting bonding pads of said chip with said patterns for connecting said solder balls as well as said conductive traces of said substrate by wire bonding.

8. The process of claim 7, wherein said step of patterning said copper foil and said heat sink layer are performed by photolithography and etching procedures.

9. The process of claim 7, wherein said conductive paste comprises silver paste and copper paste, and said conductive paste is plugged into said via holes by printing.

10. The process of claim 7, wherein said release films are easily separated from said conductive paste.

11. The process of claim 7, wherein said release film comprises polyethylene film, polypropylene film, polyester (PET) film or acrylic resin.

12. The process of claim 7, wherein said substrate is selected from the group consisting of a flexible type and a rigid type.

* * * * *